US012232435B2

(12) United States Patent
Arnaud et al.

(10) Patent No.: US 12,232,435 B2
(45) Date of Patent: Feb. 18, 2025

(54) CHIP CONTAINING AN ONBOARD NON-VOLATILE MEMORY COMPRISING A PHASE-CHANGE MATERIAL

(71) Applicants: STMicroelectronics (Crolles 2) SAS, Crolles (FR); STMicroelectronics (Grenoble 2) SAS, Grenoble (FR); STMicroelectronics (Rousset) SAS, Rousset (FR)

(72) Inventors: Franck Arnaud, St. Nazaire les Eymes (FR); David Galpin, Le Cheylas (FR); Stephane Zoll, Froges (FR); Olivier Hinsinger, Barraux (FR); Laurent Favennec, Villard Bonnot (FR); Jean-Pierre Oddou, Saint-Ismier (FR); Lucile Broussous, Goncelin (FR); Philippe Boivin, Venelles (FR); Olivier Weber, Grenoble (FR); Philippe Brun, Meylan (FR); Pierre Morin, Kessel-Lo (BE)

(73) Assignees: STMicroelectronics (Crolles 2) SAS, Crolles (FR); STMicroelectronics (Grenoble 2) SAS, Grenoble (FR); STMicroelectronics (Rousset) SAS, Rousset (FR)

( * ) Notice: Subject to any disclaimer, the term of this patent is extended or adjusted under 35 U.S.C. 154(b) by 62 days.

(21) Appl. No.: 18/130,184

(22) Filed: Apr. 3, 2023

(65) Prior Publication Data

US 2023/0263082 A1    Aug. 17, 2023

Related U.S. Application Data

(62) Division of application No. 16/184,246, filed on Nov. 8, 2018, now Pat. No. 11,653,582.

(30) Foreign Application Priority Data

Nov. 9, 2017 (FR) ........................... 1760543

(51) Int. Cl.
*H10B 63/00* (2023.01)
*G11C 13/00* (2006.01)
(Continued)

(52) U.S. Cl.
CPC ..... *H10N 70/8616* (2023.02); *G11C 13/0004* (2013.01); *G11C 13/0069* (2013.01);
(Continued)

(58) Field of Classification Search
CPC .............. H10N 70/061; H01L 45/1293; H01L 27/2436; H01L 27/2463; H01L 45/06;
(Continued)

(56) References Cited

U.S. PATENT DOCUMENTS

2003/0185047 A1    10/2003  Khouri et al.
2005/0111247 A1*    5/2005  Takaura ................. H10B 63/30
                                                        257/E27.004
(Continued)

FOREIGN PATENT DOCUMENTS

CN    206595294 U    10/2017

OTHER PUBLICATIONS

First Office Action and Search Report from counterpart CN Appl. No. 201811308746.3 dated Nov. 11, 2022, 11 pgs.
(Continued)

*Primary Examiner* — Joshua Benitez Rosario
*Assistant Examiner* — Christopher A Culbert
(74) *Attorney, Agent, or Firm* — Crowe & Dunlevy LLC

(57) ABSTRACT

An integrated circuit includes a substrate with an active area, a first insulating layer, a second insulating layer, and a phase-change material. The integrated circuit further
(Continued)

includes a heating element in an L-shape, with a long side in direct physical contact with the phase-change material and a short side in direct physical contact with a via. The heating element is surrounded by first, second, and third insulating spacers, with the first insulating spacer having a planar first sidewall in contact with the long side of the heating element, a convex second sidewall, and a planar bottom face in contact with the short side of the heating element. The second and third insulating spacers are in direct contact with the first insulating spacer and the long side of the heating element.

17 Claims, 5 Drawing Sheets

(51) Int. Cl.
*H10N 70/00* (2023.01)
*H10N 70/20* (2023.01)

(52) U.S. Cl.
CPC ............ *H10B 63/30* (2023.02); *H10B 63/80* (2023.02); *H10N 70/011* (2023.02); *H10N 70/021* (2023.02); *H10N 70/231* (2023.02); *H10N 70/826* (2023.02); *H10N 70/8265* (2023.02); *H10N 70/8413* (2023.02); *H10N 70/882* (2023.02); *G11C 2013/008* (2013.01)

(58) Field of Classification Search
CPC ............ H01L 45/1233; G11C 13/0004; G11C 13/0069
See application file for complete search history.

(56) References Cited

U.S. PATENT DOCUMENTS

| | | |
|---|---|---|
| 2007/0063180 A1 | 3/2007 | Asano et al. |
| 2008/0061282 A1 | 3/2008 | Sato et al. |
| 2015/0028283 A1 | 1/2015 | Redaelli et al. |
| 2017/0200768 A1* | 7/2017 | Park ...................... H10B 63/24 |
| 2018/0151623 A1 | 5/2018 | Terai |
| 2019/0326510 A1 | 10/2019 | Boivin et al. |

OTHER PUBLICATIONS

First Office Action from co-pending EP Appl. No. 18202683.1 dated Jan. 15, 2020 (8 pages).
INPI Search Report and Written Opinion for FR 1760543 dated May 22, 2018 (9 pages).

* cited by examiner

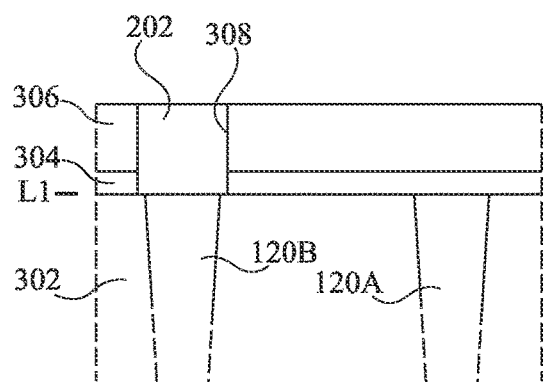
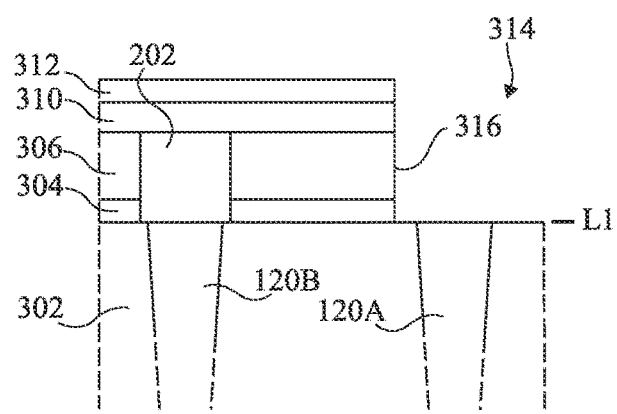
Fig 3A
Fig 3B
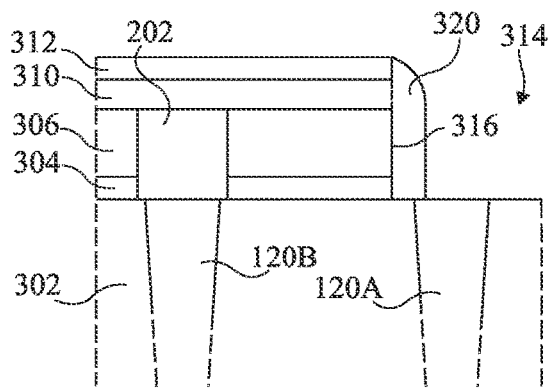
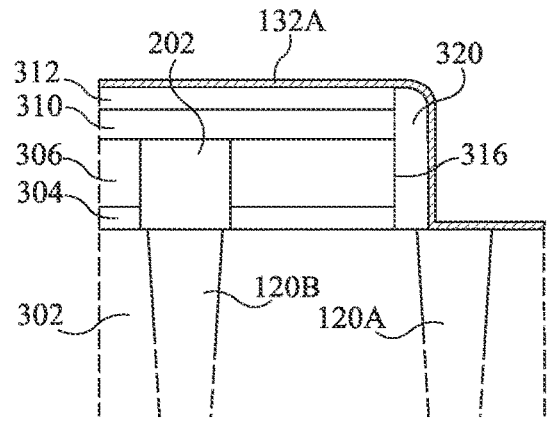
Fig 3C
Fig 3D
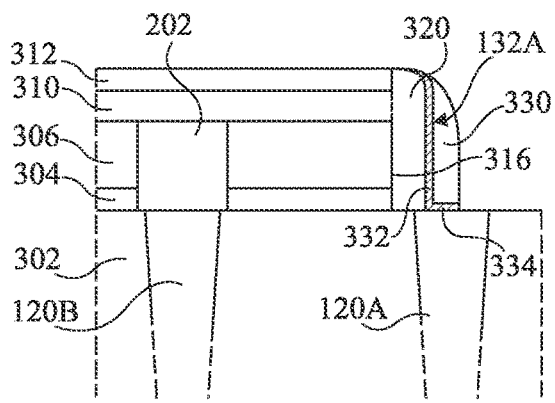
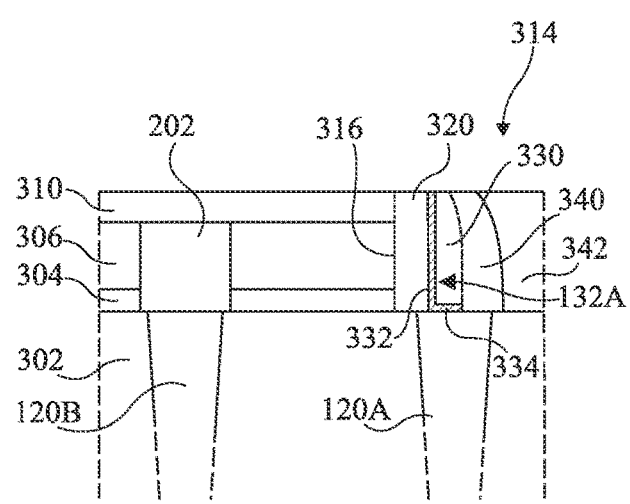
Fig 3E
Fig 3F

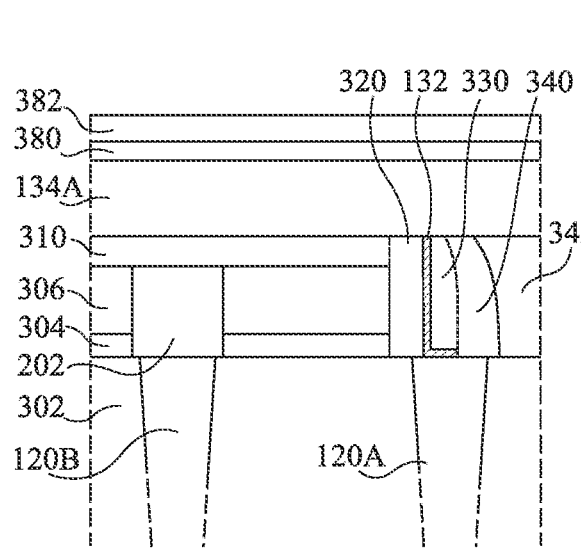
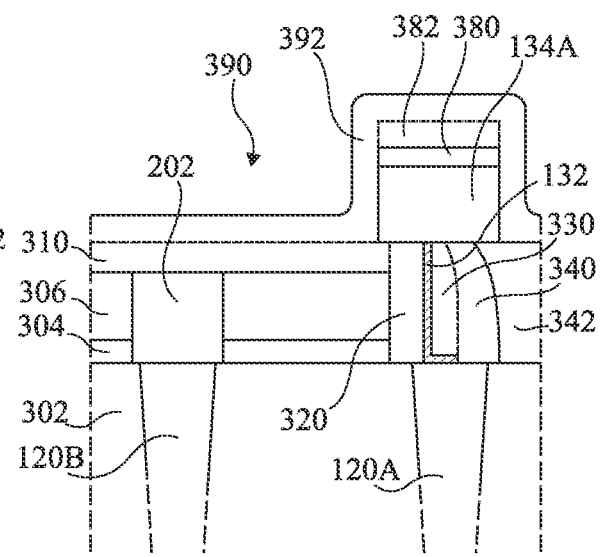
Fig 3K          Fig 3L
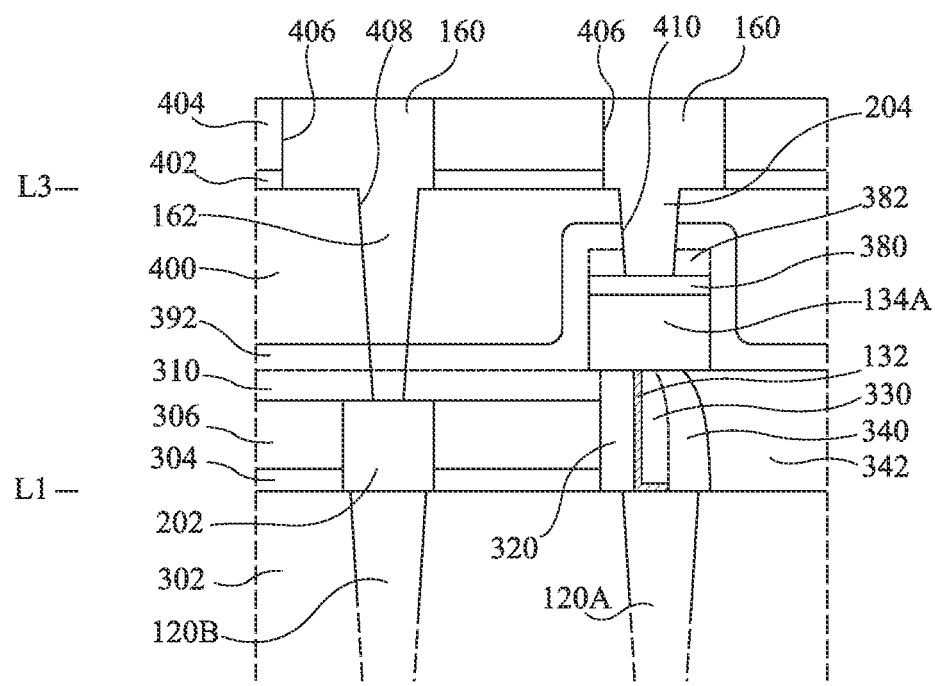
Fig 3M

CHIP CONTAINING AN ONBOARD NON-VOLATILE MEMORY COMPRISING A PHASE-CHANGE MATERIAL

RELATED APPLICATION

This application is a divisional of United States Application for patent Ser. No. 16/184,246, filed Nov. 8, 2018, which claims the priority benefit of French Application for Patent No. 1760543, filed on Nov. 9, 2017, the contents of both of which are hereby incorporated by reference in their entireties to the maximum extent allowable by law.

TECHNICAL FIELD

The present disclosure relates to electronic chips and, in particular, a chip containing a non-volatile memory comprising a phase-change material, and to a method of manufacturing such a chip.

BACKGROUND

A chip containing an onboard non-volatile memory comprising a phase-change material simultaneously comprises logic circuits and phase-change material memory cells. The memory cells and the various transistors of the circuits are electrically connected by vias to interconnection tracks located in electrically-insulating layers.

Each memory cell comprises a phase-change material and a resistive element for heating the phase-change material. The resistive heating element enables to have the phase-change material transit from a crystalline state to the amorphous state for the programming of the memory cell, and transit from an amorphous state to the crystalline state to erase the memory cell. The heating element is typically located under the phase-change material and on a via of connection to one of the terminals of one of the memory transistors.

Chips containing an onboard non-volatile memory comprising a phase-change material obtained by known methods have various disadvantages. In particular, it is desired to decrease the electric resistance of access to the transistors due, in particular, to the electric resistance of the vias.

SUMMARY

An integrated circuit disclosed herein includes: a substrate containing an active area; a first insulating layer stacked on the substrate, with a via extending through the first insulating layer to contact the active area; a second insulating layer stacked on the first insulating layer; a phase-change material stacked on the second insulating layer; and a heating element in the second insulating layer. The heating element is L-shaped with: a long side extending from, and in direct physical contact with, a top side of the via to make direct physical contact with a bottom side of the phase-change material, and a short side extending along and in direct physical contact with the top side of the via.

The integrated circuit further includes: a first insulating spacer in the second insulating layer, a first sidewall of the first insulating spacer being planar in shape and in direct physical contact with a first face of the long side of the heating element, a second sidewall of the first insulating spacer being opposite to the first sidewall and convex in shape, a bottom face of the first insulating spacer being planar in shape and in direct physical contact with the short side of the heating element; a second insulating spacer in the second insulating layer and having a first sidewall that is concave in shape and in direct physical contact with the second sidewall of the first insulating spacer; and a third insulating spacer in the second insulating layer and having a first sidewall that is planar in shape and in direct physical contact with a second face of the long side of the heating element opposite to the first face of the long side of the heating element.

The first insulating spacer may have a top face in direct physical contact with the bottom side of the phase-change material.

The bottom face of the first insulating spacer may extend laterally to, but not beyond, a distal end of the short side of the heating element.

The second insulating spacer may have a top face that is in direct physical contact with the bottom side of the phase-change material.

The second insulating spacer may have a bottom face that is in direct physical contact with the via.

The second insulating spacer may have a second sidewall opposite to its first sidewall that is concave in shape and in direct physical contact with a thermally insulating portion of the second insulating layer.

The third insulating spacer may have a top face that is in direct physical contact with the bottom side of the phase-change material.

The third insulating spacer may have a bottom face that is in direct physical contact with the via.

The heating element may be monolithic.

The first, second, and third insulating spacers may be monolithic.

A conductive layer may be formed on the phase-change material.

Also disclosed herein is an integrated circuit having: a substrate with an active area; a first insulating layer with a via to contact the active area; a second insulating layer; a phase-change material on the second insulating layer; a heating element within the second insulating layer, the heating element being formed as an L-shape with a long side in direct physical contact with the phase-change material and a short side in direct physical contact with the via; a first spacer partially surrounding the heating element and having a planar first sidewall in direct physical contact with the long side of the heating element, a convex second sidewall, and a planar bottom face in direct physical contact with the short side of the heating element; a second spacer in direct physical contact with convex second sidewall of the first spacer; and a third spacer in direct physical contact with the first spacer and the long side of the heating element.

The first spacer may extend between a top face of the short side of the heating element and the phase-change material.

The second spacer may extend between the via and the phase-change material.

The third spacer may extend between the via and the phase-change material.

A conductive layer may be formed on the phase-change material.

BRIEF DESCRIPTION OF THE DRAWINGS

The foregoing and other features and advantages will be discussed in detail in the following non-limiting description of specific embodiments in connection with the accompanying drawings, wherein:

FIGS. 3A to 3M schematically illustrate a more detailed example of steps of implementation of the method of FIGS. 2A to 2C.

DETAILED DESCRIPTION

Figure 1:
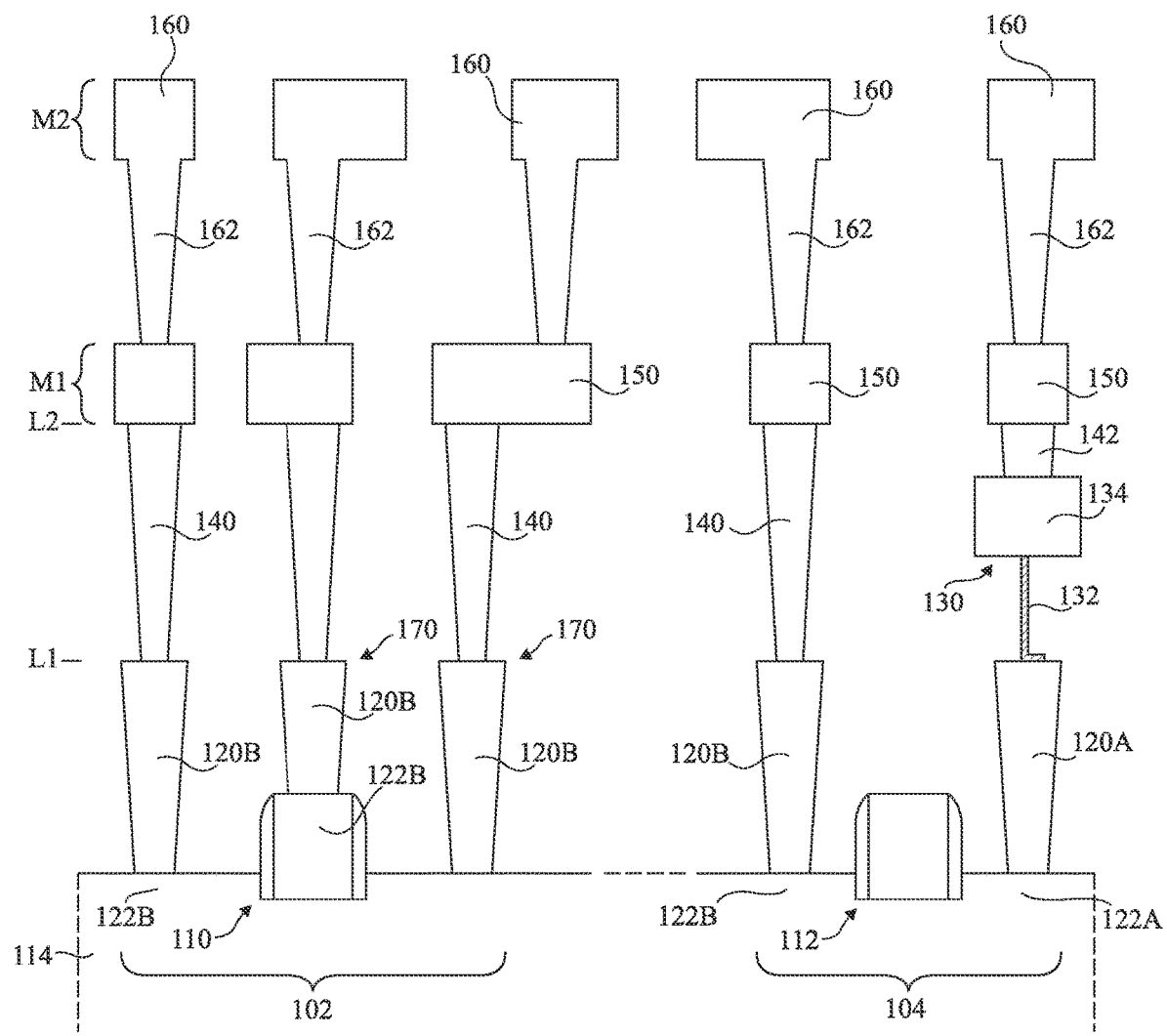
FIG. 1 is a partial simplified cross-section view of a chip containing an onboard memory comprising a phase-change material.

The same elements have been designated with the same reference numerals in the various drawings and, further, the various drawings are not to scale. For clarity, only those steps and elements which are useful to the understanding of the described embodiments have been shown and are detailed. In particular, the transistors and their manufacturing method, which are well known by those skilled in the art, are not described in detail.

In the following description, when reference is made to terms qualifying the position, such as terms "top", "bottom", "upper", "lower", etc., reference is made to the orientation of the concerned elements in the concerned cross-section views, it being understood that, in practice, the described devices may have a different orientation.

FIG. 1 is a partial simplified cross-section view of a chip containing an onboard memory comprising a phase-change material.

The chip comprises a region 102 where circuits comprising transistors 110 are located, and a region 104 where phase-change material memory cells associated with transistors 112 are located. A transistor 110 and a transistor 112 are each represented by an insulated gate having spacers on its sides. The chip has been obtained as described hereafter.

Transistors 110 and 112 have first been formed inside and on top of a substrate 114. Steps of depositing electrically-insulating layers (not shown) on the structure and of forming electrically-conductive elements in the insulator layers have then been implemented. The conductive elements formed successively are:
  vias 120A and vias 120B, vias 120A extending from contacting areas 122A of the drains of transistors 112, and vias 120B extending from contacting areas 122B of the drains, of the sources, and of the gates of transistors 110 and of the sources of transistors 112; vias 120A and 120B reach a same level L1 above substrate 114;
  memory cells 130 each comprising, on one of vias 120A, a heating element 132 topped with a region 134 of a phase-change material;
  vias 140 located on vias 120B, and vias 142, each located on one of regions 134, vias 140 and 142 extending all the way to a same level L2 above substrate 114;
  a first metal level M1 comprising first interconnection tracks 150 in contact with vias 140 and 142; and
  a second metal level M2 comprising second interconnection tracks 160 connected to tracks 150 by vias 162.

In the chip thus obtained, contacting areas, or terminals, 122B of the transistors are connected to tracks 150 of first metallization level M1 by stacks 170 of a via 120B and of a via 140. A problem is that the electric resistance of each stack 170 is high, particularly due to the great height of stack 170 and due to various issues, particularly of alignment, to form the electric contact between via 120B and via 140.

Such an electric resistance results in various performance and electric power consumption issues, particularly for the circuits of region 102.

Figure 2A:
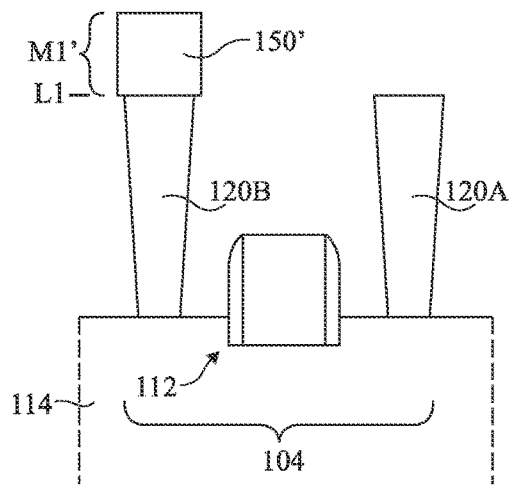
FIGS. 2A to 2C are partial simplified cross-section views illustrating steps of an embodiment of a method of manufacturing a chip containing an onboard memory comprising a phase-change material.
Figure 2B:
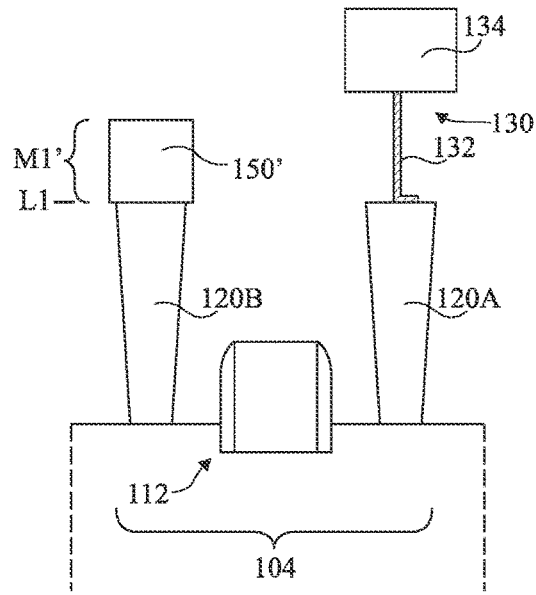
Figure 2C:
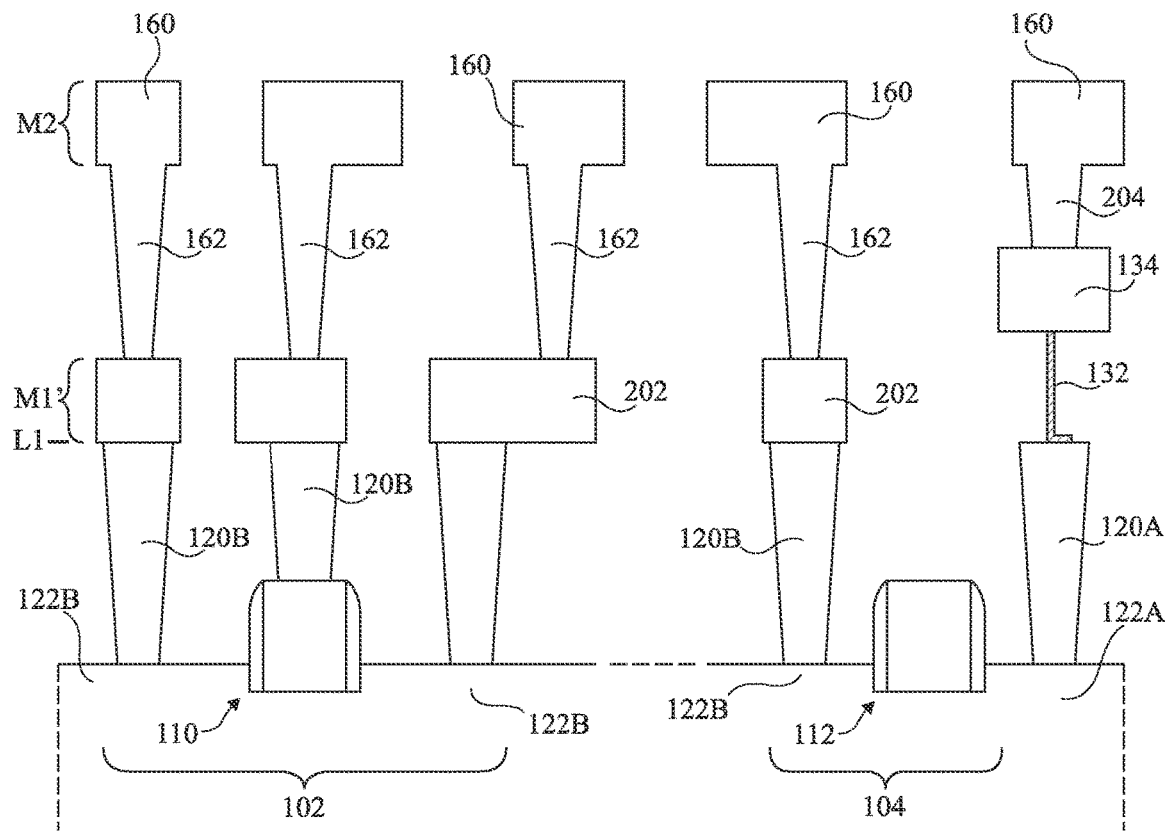

FIGS. 2A to 2C are partial simplified cross-section views illustrating steps of an embodiment of a method of manufacturing a chip containing an onboard memory comprising a phase-change material. Only a region 104 of phase-change material memory is partially shown in FIGS. 2A and 2B. As in FIG. 1A, the insulating layers covering the transistors and the substrate are not shown in FIGS. 2A and 2B.

At the step of FIG. 2A, elements identical or similar to those of the chip of FIG. 1 located under the same level L1 as that of FIG. 1, arranged identically or similarly, are formed. These elements are particularly, in region 104, a transistor 112 and, from drain contacting areas 122A and source contacting areas 122B of transistor 112, respective vias 120A and 120B extending all the way to level L1.

A first metal level M1' comprising first interconnection tracks 202 on vias 120B is formed. It should be noted that no track is formed on vias 120A. Conversely to tracks 150 of FIG. 1, tracks 202 are directly in contact with vias 120B.

At the step of FIG. 2B, memory cells 130 each comprising, on one of vias 120A, a heating element 132 topped with a phase-change material region 134 are formed.

At the step of FIG. 2C, a second metal level M2, located above the level of regions 134 and comprising second interconnection tracks 160, is formed. Tracks 160 are connected to tracks 150 by vias 162 and to regions 134 by vias 204.

In the obtained chip, each memory cell has its phase-change material 134 located between levels M1' and M2.

According to an advantage, due to the fact that phase-change material regions 134 are located between levels M1' and M2, it has been possible to directly connect tracks 202 of first metal level M1' to contacting areas 122B of the transistors by vias 120B. The electric resistance of access to the transistors is particularly decreased. Indeed, unlike stacks 170 of the chip of FIG. 1, vias 120B are formed in a single step. Further, vias 120B have a decreased height as compared with stacks 170 of the chip of FIG. 1. As a result, the circuits of region 102 have a decreased electric power consumption. It should be noted that this advantage of a decreased electric resistance also exists for the direct connection by via 120B between transistors 112 of region 104 of memory cells and tracks 202, which provides a decreased electric power consumption of the memory cells.

According to another advantage, the connection between phase-change material 134 and tracks 160 is formed by single via 204, unlike the connection between phase-change material 134 and tracks 160 of the chips of FIG. 1, formed by a via 142, a track 150, and a via 162. Various issues of the forming of a via 142 of FIG. 1, such as alignment issues, are thus avoided.

Figure 3G:
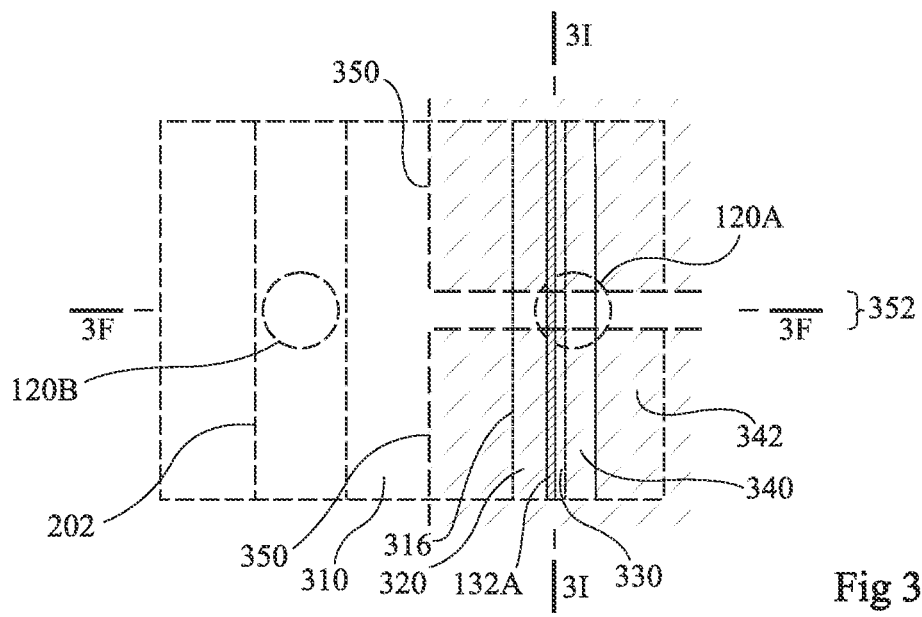
Figure 3H:
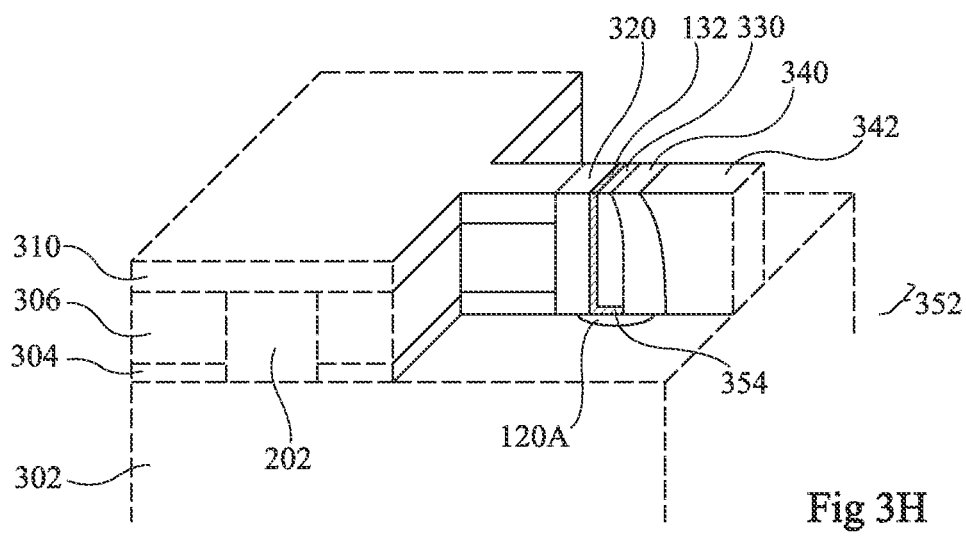
Figure 3I:
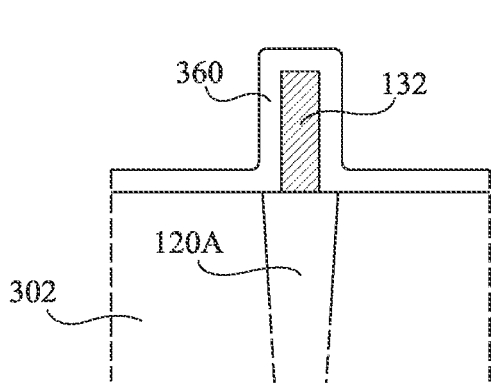
Figure 3J:
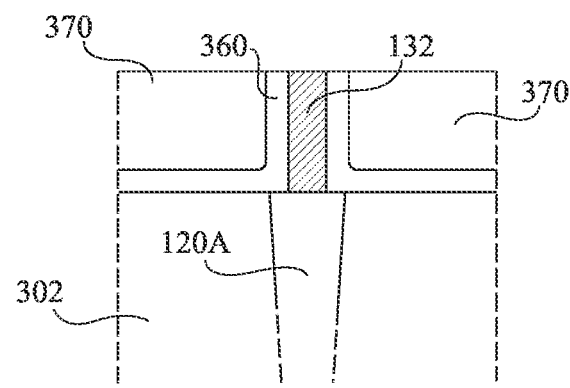

FIGS. 3A to 3L schematically illustrate a more detailed example of steps of implementation of the method of FIGS. 2A to 2C. FIGS. 3A to 3F are partial cross-section views along a first direction, FIG. 3G is a partial top view, FIG. 3H is a partial perspective view, FIGS. 3I and 3J are partial cross-section views along a second direction orthogonal to the first direction, and FIGS. 3K and 3L are partial cross-sections views along the first direction. Only memory region 104 is partially shown.

FIG. 3A illustrates the step of forming the first metal level of FIG. 2A. It is started from the structure comprising the elements located under level L1, particularly vias 120A and 120B, only the upper portions thereof being shown. Vias 120A and 120B are in an insulator layer 302, for example made of silicon oxide or comprising silicon oxide, and are flush with the surface of insulator layer 302 at level L1. As an example, vias 120A and 120B are made of tungsten.

The structure is covered with an etch stop layer 304, for example, made of silicon carbonitride. A layer 306 is then formed on the structure, preferably thermally insulating and with a low dielectric constant, for example, made of silicon oxide, for example, porous. As an example, layer 304 has a thickness in the range from 10 to 25 nm. Layer 306 has a thickness for example in the range from 30 to 200 nm.

Trenches 308 crossing layers 306 and 304 at the locations of the future first interconnection tracks 202, that is, above vias 120B, are then etched. The trenches are etched all the way to the upper surface, or top, or vias 120B.

After this, trenches 308 are filled with an electrically-conductive material, for example, copper, up to the upper level of layer 306. To perform this filling, the structure may for example be covered with a layer of the conductive material filling trenches 308, and then all the elements located above the upper level of layer 306 may be removed by chem.-mech. polishing.

At the step of FIG. 3B, the structure is covered with a layer 310, for example, made of silicon nitride, intended to protect tracks 202 during the forming of the memory cell. A silicon oxide layer 312 is then formed on the structure. As an example, protection layer 310 has a thickness in the range from 10 to 40 nm.

After this, the entire thickness of layers 312, 310, 306 and 304 is etched in portions 314, to at least partly expose the top of each of vias 120A. The remaining portions of the etched layers exhibit sides 316. For each via 120A, a side 316 is positioned with respect to via 120A in a selected way described hereafter in relation with the step of FIG. 3C.

A the step of FIG. 3C, a spacer 320 is formed against each side 316, that is, the structure is covered with a layer of the material of spacer 320, for example, a silicon nitride, and the horizontal portions of this layer are removed by anisotropic etching. The position relative to via 120A of side 316 obtained at the step of FIG. 3B, and the thickness of spacer 320, are selected so that spacer 320 partially covers the top of via 120A while leaving via 120A partially exposed, that is, so that the exposed side of the spacer is located vertically in line with via 120A. As an example, spacers 320 have a thickness in the range from 5 to 30 nm.

At the step of FIG. 3D, the structure is conformally covered with a layer 132A intended to form the future heating elements. Layer 132A is for example made of silicon nitride and of titanium TiSiN. Layer 132A covers a side of each spacer 320 and a portion of each via 120A. As an example, layer 132A has a thickness in the range from 2 to 10 nm.

At the step of FIG. 3E, a spacer 330, for example, made of silicon nitride, is formed against the portion of layer 132A covering each spacer 320. The portions which have remained exposed of layer 132A are removed by etching. At this step, there only remain of layer 132A vertical portions 332 between spacers 320 and 330, and horizontal portions 334 under spacers 330. As an example, spacers 330 have a thickness in the range from 5 to 30 nm.

At the step of FIG. 3F, a spacer 340, for example, made of silicon nitride, is formed against each spacer 330. Spacers 340 cover the sides of horizontal portions 334 of the remainders of layer 132A. As an example, spacers 340 have a thickness in the range from 5 to 30 nm.

After this, the structure is covered with a layer 342, preferably thermally insulating, for example, made of silicon oxide, reaching, in the portions 314 etched at the step of FIG. 3B and which have remained exposed, the level of the upper surface of layer 310. All the elements located abode the upper level of layer 310 are then removed by chemical-mechanical polishing (CMP).

FIG. 3G is a top view of the structure of FIG. 3F in the example of a rectilinear side 316. The various elements covering vias 120A, 120B and insulator 302, up to the upper level of vias 120A and 120B, are etched in regions 350 shown in FIG. 3G by hatchings delimited by dotted lines. Regions 350 are provided so that the etching leaves in place, for each via 120A, the elements located in top view for example in a strip 352 running over via 120A and extending in the spacer thickness direction, that is, orthogonally to the direction of side 316. Regions 350 are provided so that the etching further leaves in place the portions of layers 304, 306 and of protection layer 310 surrounding and covering tracks 202.

FIG. 3H shows the structure obtained after etching of regions 350. The etching has individualized for each via 120A a vertical portion of layer 132A located on via 120A (only a portion of the upper surface thereof being shown). This portion forms heating element 132. The heating element extends in its lower portion in a horizontal portion 334. Portions of spacers 320, 330 sandwiching the heating element and covering horizontal portion 334, and a spacer portion 340 against the side of horizontal portion 334, have been left in place.

Preferably, the width of the heating element, corresponding to the width of strip 352, is small, for example, smaller than 30 nm. As an example, the heating element is integrally located on via 120A. As an example, via 120A has a diameter in the range from 30 to 60 nm.

At the step of FIG. 3I, the entire structure is conformally covered with a protection layer 360, for example, made of silicon nitride.

At the step of FIG. 3J, a layer 370 of a material which is preferably thermally insulating, for example, a silicon oxide, is deposited on the structure, reaching, in the portions of regions 150 which have remained exposed, the upper level of heating elements 132. All the elements located above the upper level of heating elements 132 are then removed by chemical-mechanical polishing.

Each heating element 132 thus obtained is totally surrounded with the portions of spacers 320, 330, 340 and of layer 360.

At the step of FIG. 3K, the structure is covered: with a layer 134A of the phase-change material, for example, a chalcogenide; with an electrically-conductive layer 380, for example, made of titanium nitride; and then with a masking layer 382, for example, made of silicon nitride.

At the step of FIG. 3L, layers 382, 380, and 134A are etched in regions 390, to leave in place, on each heating element, a region 134A of the phase-change material topped with a portion of layer 380 forming a contacting area. The memory cells have thus been formed.

After this, the structure is covered with a protection layer 392, for example, a silicon nitride.

The step of FIG. 3M corresponds to that of FIG. 2C, of forming vias 162 and 204 and second interconnection tracks 160. The structure is covered with an insulator 400, for example, based on silicon oxide, up to a level L3.

The structure is then successively covered with an etch stop layer 402, for example, made of silicon carbonitride, and with a layer 404 having a low dielectric constant, for example, made of silicon oxide, for example, porous.

Trenches 406 crossing layers 404 and 402 across their entire thickness are etched at the locations of the future second interconnection tracks 160.

The locations of the future vias 162 and 204 are etched from the bottom of trenches 406, all the way to tracks 202 for vias 162 (location 408), and all the way to contacting area 380 (location 410) for vias 204.

After this, trenches 406 and locations 408 and 410 are filled with a conductive material, for example, copper, up to the upper level of layer 404.

In addition to the advantages already described, an advantage of the chip obtained by implementing the method example of FIGS. 3A to 3M results from the fact that each heating element 132 is laterally surrounded with portions of layers 306 and 342 as well as with portions of layer 370 (not shown in FIG. 3M). The portions of layers 306 and 342 surround heating element 132 along a direction orthogonal to that of side 316 (along the plane of FIG. 3M), and the portions of layer 370 surround heating element 132 along a direction parallel to that of side 316. The portions of layers 306, 342, and 370 thus form a thermally-insulating region, for example, made of silicon oxide, crossed by heating element 132. Silicon oxide has a low thermal conductivity, smaller than a value in the order of 1.5 W/(m·K) that is, for example, more than from 10 to 40 times smaller than that of silicon nitride (which may for example be in the order of 17 W/(m·K)). This enables to avoid, when the heating element heats up for example during the memory cell programming, for the regions surrounding the heating element to also heat up. Such a heating would risk causing, for example, the erasing of neighboring memory cells. Further, it is avoided for part of the heat generated in the heating element to be lost in the surrounding regions. Small quantities of generated heat are then sufficient to heat up the heating element, which corresponds to a decreased electric power consumption to program and erase the memory cell.

It should be noted that each heating element is separated from the materials of layers 306, 342, and 370 by portions of spacers 320, 330, and 340 and of layer 360, for example, made of silicon nitride. The portions of spacers 320, 330, and 340 and of layer 360 thus form a region of protection of the heating element. This enables for each heating element to be only in contact with the silicon nitride. A contact between the heating element and a material such as, for example, the silicon oxide of layers 306, 342, and 370, is thus avoided. Such a contact would be likely to alter the material of the heating element, for example, if the heating element is made of titanium silicon nitride.

According to another advantage, the provision of a heating element having a decreased width enables to decrease the volume of phase-change material to be heated for the programming or the erasing. Small quantities of heat generated in the heating element are sufficient to program and erase the memory cell, which provides a decreased electric power consumption.

Specific embodiments have been described. Various alterations, modifications, and improvements will occur to those skilled in the art. Although, in the steps of FIGS. 3A to 3M, thermally-insulating regions (portions of layers 306, 342, and 370) crossed by heating elements are made of silicon oxide, any adapted thermally-insulating material, that is, having a thermal conductivity smaller for example than 2 W/(m·K), may be used for these regions. As an example, the silicon oxide of all or part of these regions may be replaced with silicon oxycarbide, for example, porous. Spacers 320 and 340 may then be omitted in the case where a material which can be in contact with the heating element without risking damaging it is used.

Further, although spacers 320, 330, and 340, and layer 370 described hereabove are made of silicon nitride, the silicon nitride of all or part of these regions may be replaced with any other material capable of protecting the heating element, such as silicon carbonitride.

Although a specific example of steps of implementation of the method of FIGS. 2A to 2C has been described in relation with FIGS. 3A to 3M, any other steps capable of implementing the method of FIGS. 2A to 2C may be provided. In particular, the steps of forming the heating elements and of forming phase-change material regions, described in relation with FIGS. 3A to 3M, may be replaced with any method of forming heating elements topped with phase-change material regions.

Although the transistors 110 and 112 described hereabove are represented by gates having spacers on their sides, transistors 110 and/or 112 may be bipolar transistors, the above-described gates, sources, and drains then respectively corresponding to the bases, collectors, and emitters of the transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit, comprising:
   a substrate containing an active area;
   a first insulating layer stacked on the substrate;
   a via extending through the first insulating layer to contact the active area;
   a second insulating layer stacked on the first insulating layer;
   a phase-change material stacked on the second insulating layer;
   a heating element in the second insulating layer, the heating element being L-shaped with:
      a first side extending from, and in direct physical contact with, a top side of the via to make direct physical contact with a bottom side of the phase-change material; and
      a second side, shorter than the first side, extending along and in direct physical contact with the top side of the via;
   a first insulating spacer in the second insulating layer, a first sidewall of the first insulating spacer being planar in shape and in direct physical contact with a first face of the first side of the heating element, a second sidewall of the first insulating spacer being opposite to the first sidewall and convex in shape, a bottom face of the first insulating spacer being planar in shape and in direct physical contact with the second side of the heating element;
   a second insulating spacer in the second insulating layer and having a first sidewall that is concave in shape and in direct physical contact with the second sidewall of the first insulating spacer, wherein the second insulating spacer has a second sidewall opposite to its first sidewall that is concave in shape and in direct physical contact with a thermally insulating portion of the second insulating layer; and
   a third insulating spacer in the second insulating layer and having a first sidewall that is planar in shape and in direct physical contact with a second face of the first side of the heating element opposite to the first face of the first side of the heating element.

2. The integrated circuit of claim 1, wherein the first insulating spacer has a top face in direct physical contact with the bottom side of the phase-change material.

3. The integrated circuit of claim 1, wherein the bottom face of the first insulating spacer extends laterally to, but not beyond, a distal end of the second side of the heating element.

4. The integrated circuit of claim 1, wherein the second insulating spacer has a top face that is in direct physical contact with the bottom side of the phase-change material.

5. The integrated circuit of claim 1, wherein the second insulating spacer has a bottom face that is in direct physical contact with the via.

6. The integrated circuit of claim 1, wherein the third insulating spacer has a top face that is in direct physical contact with the bottom side of the phase-change material.

7. The integrated circuit of claim 1, wherein the third insulating spacer has a bottom face that is in direct physical contact with the via.

8. The integrated circuit of claim 1, wherein the heating element is monolithic.

9. The integrated circuit of claim 1, wherein the first insulating spacer is monolithic.

10. The integrated circuit of claim 1, wherein the second insulating spacer is monolithic.

11. The integrated circuit of claim 1, wherein the third insulating spacer is monolithic.

12. The integrated circuit of claim 1, further comprising a conductive layer formed on the phase-change material.

13. An integrated circuit, comprising:
a substrate with an active area;
a first insulating layer with a via to contact the active area;
a second insulating layer;
a phase-change material on the second insulating layer;
a heating element within the second insulating layer, the heating element having an L-shape with a first side in direct physical contact with the phase-change material and a second side, shorter than the first side, in direct physical contact with the via;
a first spacer partially surrounding the heating element and having a planar first sidewall in direct physical contact with the first side of the heating element, a convex second sidewall, and a planar bottom face in direct physical contact with the second side of the heating element;
a second spacer having a first sidewall in direct physical contact with convex second sidewall of the first spacer, wherein the second insulating spacer has a second sidewall opposite to its first sidewall that is concave in shape and in direct physical contact with a thermally insulating portion of the second insulating layer; and
a third spacer in direct physical contact with the first insulating layer and a third side of the heating element that is opposite to the first side of the L-shape of the heating element.

14. The integrated circuit of claim 13, wherein the first spacer extends between a top face of the second side of the heating element and the phase-change material.

15. The integrated circuit of claim 13, wherein the second spacer extends between the via and the phase-change material.

16. The integrated circuit of claim 13, wherein the third spacer extends between the via and the phase-change material.

17. The integrated circuit of claim 13, further comprising a conductive layer formed on the phase-change material.

* * * * *